United States Patent
Jenne et al.

(10) Patent No.: US 7,057,919 B1
(45) Date of Patent: Jun. 6, 2006

(54) MAGNETIC MEMORY ARRAY CONFIGURATION

(75) Inventors: Frederick B. Jenne, Los Gatos, CA (US); Gary A. Gibbs, San Jose, CA (US)

(73) Assignee: Silicon Magnetic Systems, San Jose, CA (US)

( * ) Notice: Subject to any disclaimer, the term of this patent is extended or adjusted under 35 U.S.C. 154(b) by 116 days.

(21) Appl. No.: 10/699,155

(22) Filed: Oct. 31, 2003

(51) Int. Cl.
*G11C 11/00* (2006.01)
*G11C 11/14* (2006.01)
*G11C 11/15* (2006.01)

(52) U.S. Cl. .................... 365/158; 365/171; 365/173
(58) Field of Classification Search ............... 365/158, 365/171, 173
See application file for complete search history.

(56) References Cited

U.S. PATENT DOCUMENTS

| | | | |
|---|---|---|---|
| 6,055,178 A | 4/2000 | Naji | |
| 6,104,633 A | 8/2000 | Abraham et al. | |
| 6,147,922 A | 11/2000 | Hurst, Jr. et al. | |
| 6,272,040 B1 | 8/2001 | Salter et al. | |
| 6,639,831 B1 * | 10/2003 | Pancholy et al. | 365/158 |
| 6,674,664 B1 * | 1/2004 | Pohm | 365/173 |
| 6,822,278 B1 * | 11/2004 | Koutny | 365/171 |
| 6,862,215 B1 * | 3/2005 | Pancholy et al. | 365/158 |

* cited by examiner

Primary Examiner—Trong Phan
(74) Attorney, Agent, or Firm—Kevin L. Daffer; Mollie E. Lettang; Daffer McDaniel, LLP (57) ABSTRACT

A memory array configuration is provided that includes a plurality of magnetic cell junctions and a conductive line comprising a gate of a first transistor configured to enable a read operation for one of a plurality of magnetic cell junctions and a gate of a second transistor configured to enable a write operation for another of the plurality of magnetic cell junctions. Another memory array configuration is provided which includes a set of conductive structures serially coupled to a bit line spaced apart from and, in some embodiments, directly above a magnetic cell junction, a transistor coupled to the set of conductive structures and a program line collectively configured with the bit line to induce current flow through the set of conductive structures upon an application of a voltage to a gate of the transistor. A method for operating such a magnetic memory array is also contemplated herein.

20 Claims, 4 Drawing Sheets

MAGNETIC MEMORY ARRAY CONFIGURATION

BACKGROUND OF THE INVENTION

1. Field of the Invention

This invention relates to magnetic memory arrays and, more particularly, to data line configurations within magnetic memory cells.

2. Description of the Related Art

The following descriptions and examples are given as background information only.

Recently, advancements in the use of magnetoresistive materials have progressed the development of magnetic random access memory (MRAM) devices to function as viable non-volatile memory circuits. In general, MRAM circuits exploit the electromagnetic properties of magnetoresistive materials to set and maintain information stored within individual magnetic memory cell junctions of the circuit. In particular, MRAM circuits utilize magnetization direction to store information within a magnetic junction, and differential resistance measurements to read information from the magnetic junction. In general, an MRAM circuit includes one or more conductive lines with which to generate magnetic fields such that the magnetization directions of one or more magnetic junctions of the MRAM circuit may be set. Consequently, in some embodiments, the conductive lines may be referred to as "field-inducing lines."

Typically, the conductive lines are formed as substantially straight and uniform structures of metal spaced parallel and perpendicular to each other within a plane comprising the magnetic cell junctions. In other words, the conductive lines are generally arranged in series of columns and rows having magnetic junctions interposed at the overlap points of the conductive lines. In this manner, the circuit may include a plurality of memory cells arranged within an array. In some cases, the conductive lines may be referred to as "bit" and "digit" lines. In general, "bit" lines may refer to conductive lines that are used for both read and write operations of the magnetic junction. In most cases, the bit lines are arranged in contact with the magnetic junctions. "Digit" lines, on the other hand, may refer to the conductive lines spaced vertically adjacent to the magnetic junctions and used primarily during write operations of the array.

In general, an individual magnetic junction can be written to by applying current simultaneously along a bit line and a digit line corresponding to the particular magnetic junction. Such an individual magnetic junction may herein be referred to as a selected magnetic junction, or the magnetic junction intentionally targeted for a writing procedure. During the writing procedure, however, the multitude of other magnetic junctions arranged vertically adjacent to the bit line and the digit line corresponding to the selected junction will also sense current. Such magnetic junctions are herein referred to as half-selected junctions or disturbed junctions, since a magnetic field is induced about them from the bit or digit line used to program the selected magnetic junction. Even though a less effective magnetic field is applied to these disturbed cells, variations within the magnetic junctions may allow the magnetic field induced by one current carrying line to switch the magnetization directions of one or more of the disturbed cells. In this manner, the write selectivity of the array may be reduced. Write selectivity, as used herein, may refer to the relative difference (i.e., current margin) between the amount of current responsible for switching the magnetization of a disturbed cell and the amount of current needed to switch the magnetization of a selected cell. Consequently, a reduction in write selectivity reduces the tolerance of the current used to reliably switch selected cells without switching disturbed cells within an array. In some cases, the tolerance may be too small, allowing a false bit to be unintentionally written to one or more of the disturbed cells and in turn, decreasing the functionality of the array.

In addition, the number of memory cells arranged within an array may be limited by the arrangement of the conductive lines spanning across the columns and rows of the array. In general, the voltage required to generate a desired amount of current along a conductive line increases as the length of a conductive line increases, due to the current-resistance (IR) drop along the line. Since it is desirable to limit the overall power requirements of an array and, therefore, the amount of current used to operate the array, the conductive lines are generally restricted in length. In addition, the maximum voltage that may be used to operate an array may be restricted by the voltage supply coupled to the array, independent of the length of the conductive lines. Consequently, the number of magnetic junctions within an array is limited. In some cases, such a restriction causes the desired number of cells for a memory chip to be arranged within multiple arrays. Such an arrangement of cells, however, undesirably occupies a larger area of the wafer, increasing the size of the chip. As a result, fewer chips may be fabricated on the wafer, causing fabrication costs to increase and production throughput to decrease.

Therefore, it would be advantageous to develop a magnetic memory array with a configuration that requires a smaller operation voltage than memory arrays which employ both bit lines and digit lines to write to magnetic cell junctions. In addition, it may be advantageous to fabricate a magnetic memory array with a reduced memory cell size. Moreover, it would be advantageous to develop a magnetic memory array with a configuration that increases the write selectivity of a magnetic memory array.

SUMMARY OF THE INVENTION

The problems outlined above may be in large part addressed by a memory array that includes a plurality of magnetic cell junctions and a conductive line arranged in alignment with the magnetic cell junctions. In general, the conductive line may include a gate of a first transistor configured to enable a read operation for one of a plurality of magnetic cell junctions and a gate of a second transistor configured to enable a write operation for another of the plurality of magnetic cell junctions. In some embodiments, the gate of the first transistor may be one of a plurality of gates within the conductive line which are configured to enable read operations for a first set of the magnetic cell junctions. In addition, the gate of the second transistor may be one of a plurality of gates within the conductive line which is configured to enable write operations for a second set of the magnetic cell junctions. In some cases, the gates configured to enable read operations for the first set of the magnetic cell junctions and the gates configured to enable write operations for the second set of the magnetic cell junctions, in such an embodiment, may be alternately arranged within the conductive line.

In some embodiments, the memory array may include a second conductive line comprising a gate of a third transistor which is configured to enable a write operation for the magnetic cell junction having a read operation enabled by the first transistor. In such an embodiment, the second and third transistors may, in some case, be coupled to a common program line. In addition or alternatively, the second conductive line may include a gate of a fourth transistor which is configured to enable a read operation for the magnetic cell junction having a write operation enabled by the second transistor. In such an embodiment, the first and fourth transistors may be coupled to a common ground contact.

A memory array configured to induce a magnetic field about a magnetic cell junction upon an application of a voltage to a gate of transistor is also contemplated herein. In particular, the memory array may include a set of conductive structures serially coupled to a bit line spaced apart from a magnetic cell junction, a transistor coupled to the set of conductive structures and a program line collectively configured with the bit line to induce current flow through the set of conductive structures upon an application of a voltage to a gate of the transistor. In general, one or more of the set of conductive structures are configured to induce a magnetic field about the magnetic cell junction. In this manner, a magnetic field may be induced about the magnetic cell junction upon the application of the voltage to the transistor. In some cases, the set of conductive structures may include at least one structure arranged in contact with the magnetic cell junction. In this manner, current may be conducted through the magnetic cell junctions upon an application of a voltage to a read transistor of the memory array.

In some cases, the set of conductive structures may include at least two segments respectively aligned with opposing sides of the magnetic cell junction. In addition, the set of conductive structures may include a third segment connecting the two segments. In some cases, the two segments may be arranged parallel to each other. In such an embodiment, the magnetic cell junction may be configured to have an easy axis arranged at an angle between approximately 0° and approximately 90° relative to the two segments. In any case, the bit line may be spaced directly above the magnetic cell junction in some embodiments. Consequently, a memory array including a bit line spaced above and arranged in vertical alignment with a plurality of magnetic cell junctions is provided herein. In some cases, the memory array may include a different bit line spaced apart from a second magnetic cell junction. In such an embodiment, the program line may be co-configured, with the different bit line, to induce current flow through a second set of conductive structures extending from the different bit line and arranged adjacent to the second magnetic cell junction upon an application of a voltage to a gate of a different transistor.

A method for operating a magnetic memory array is provided herein. In particular, the method includes applying a voltage to a gate of a transistor coupled to a magnetic cell junction and respectively applying high and low voltages to two conductive lines coupled to the transistor to induce a magnetic field about the magnetic cell junction. In some cases, the method of operation may further include applying a voltage to a gate of a different transistor coupled to the magnetic cell junction and applying a bias voltage to the two conductive lines to conduct current through the magnetic cell junction.

There may be several advantages for providing the memory array described herein. In particular, the arrangement of a plurality of conductive structures which extend from a global bit line and are configured to induce a magnetic field about a specific magnetic cell junction without inducing a magnetic field about other magnetic cell junctions in the array may advantageously increase the write selectivity of a memory array, improving the reliability of the array. In addition, configuring the conductive structures to align with opposing sides of the magnetic cell junction may increase the magnetic field induced for a given amount of current. Consequently, the amount of voltage needed to operate the array may be reduced. Furthermore, the issue of IR drop as a limiting factor for the number of cells fabricated along one dimension of a memory array may be reduced. Moreover, sharing a program line between memory cells may reduce memory cell sizes. Consequently, a higher density memory cell array may be fabricated.

BRIEF DESCRIPTION OF THE DRAWINGS

Other objects and advantages of the invention will become apparent upon reading the following detailed description and upon reference to the accompanying drawings in which:

FIG. 6a depicts a partial top view of a microelectronic topography having conductive structures arranged adjacent to a magnetic cell junction and extending from a bit line;

FIG. 6b depicts a partial cross-sectional view of the microelectronic topography depicted in FIG. 6a taken along line AA;

FIG. 6c depicts a partial cross-sectional view of the microelectronic topography depicted in FIG. 6a taken along line BB;

FIG. 6d depicts an alternative partial cross-sectional view of the microelectronic topography depicted in FIG. 6a taken along line BB;

FIG. 7a depicts a partial top view of a microelectronic topography having conductive structures arranged adjacent to a magnetic cell junction and extending from a bit line in a different configuration that the microelectronic topography depicted in FIG. 6a;

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
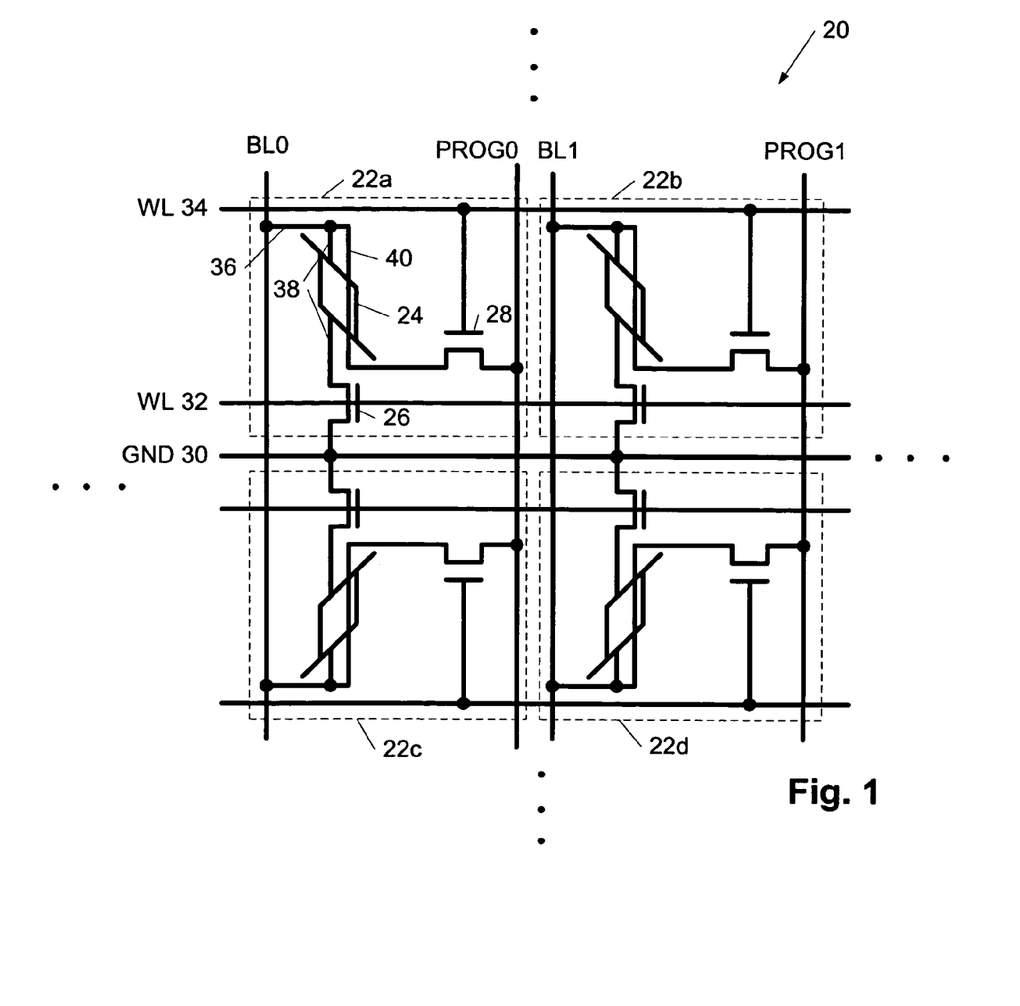
FIG. 1 depicts an electrical schematic diagram of a partial magnetic memory array.

Turning to the drawings, exemplary embodiments of magnetic memory arrays and magnetic memory cells are provided. In addition, an exemplary method for operating a magnetic memory array is provided. FIG. 1 depicts an electrical schematic diagram of partial memory array 20 including memory cells 22a–22d. Memory cells 22a–22d are outlined by dotted lines indicating arbitrary boundaries of the cells. The dotted lines are merely illustrated to distinguish the arrangement of memory cells within the array and to describe components of the memory cells. Therefore, the dotted lines outlining the periphery of the memory cells in FIG. 1 are not included within memory array 20 and do not serve a function for the memory array. In addition, the placement of the dotted-line boundaries are arbitrary and therefore, the size of the memory cells are not restricted to the dotted lines themselves. In addition, although FIG. 1 illustrates an array having two rows and two columns of memory cells, magnetic memory array 20 may include any number of rows and columns of magnetic memory cells as indicated by the continuation dots arranged along the periphery of magnetic memory array 20. It is noted that the aforementioned discussion of dotted lines and continuation dots are applicable to the magnetic memory arrays illustrated in FIGS. 3 and 4 as well.

As shown in FIG. 1, each of memory cells 22a–22d may include a bit line and a program line. In particular, memory cells 22a and 22c may include bit line BL0 and program line PROG0. In addition, memory cells 22b and 22d may include bit line BL1 and program line PROG1. In some embodiments, memory cells 22a–22d may be coupled to the same program line. An exemplary embodiment including such a configuration is described in more detail below in reference to FIG. 4. A bit line, as used herein, may refer to a conductive line used to both write bit values to and read bit values from a magnetic cell junction. A "program line," on the other hand, may refer to a conductive line used in connection with a program transistor, as defined below, and a bit line to write to a magnetic cell junction. A program line differs from a bit line in that it is generally not used for read operations of the memory array. As noted below, voltage may be applied to program line PROG0 during a read operation of memory cell 22a in some embodiments. However, such a voltage application does not generally affect the read operation of the memory cell and, therefore, program line PROG0 is not referred to as being used for the read operation of memory cell 22a.

In general, each of the memory cells within memory array 20 may include substantially similar components. Therefore, the description of the components within memory cell 22a, as described below, may pertain to each of the memory cells of the array. Accordingly, memory cells 22b–22d may include components which function in a substantially similar manner as the components described below for memory cell 22a. Although memory cell 22a is shown to include a single magnetic cell junction, magnetic memory array 20 is not restricted to such a configuration. In particular, the magnetic memory arrays described herein may be applicable for differential memory cell arrays or single cell memory arrays. In general, differential memory cell arrays are configured such that a differential resistance measurement may be obtained between two magnetic junctions of an individual memory cell during a read operation of the memory array. On the other hand, a single memory array may be configured such that a differential resistance measurement may be obtained between the magnetic junction of a memory cell and a magnetic junction of one or more reference cells arranged along the same row of the array. An exemplary configuration of a differential memory cell array including the components described in reference to memory array 20 in FIG. 1 is described in more detail below in reference to memory array 52 in FIG. 3.

As shown in FIG. 1, memory cell 22a may include magnetic cell junction 24, read transistor 26 and program transistor 28. In addition, memory cell 22a may include structures which constitute conductive paths passing through and adjacent to magnetic cell junction 24 and coupled to transistors 26 and 28. In particular, memory cell 22a may include structures which constitute conductive paths 38 and 40 extending from conductive line 36, which is coupled to bit line BL0. Exemplary configurations of structures constituting conductive paths 38 and 40 are described in more detail below in reference to FIGS. 6a–7c. In general, conductive path 38 may be configured to conduct current from conductive line 36 through magnetic cell junction 24 upon an application of a voltage to a gate of read transistor 26 such that a resistance measurement may be obtained for a read operation of the memory cell. Consequently, the term "read transistor", as used herein, may refer to a transistor coupled to a plurality of conductive structures used to induce current flow through a magnetic cell junction for a read operation of a memory cell. Conductive path 40, on the other hand, may be configured to conduct current adjacent to magnetic cell junction 24 such that a magnetic field is induced around magnetic cell junction 24 for a write operation of memory cell 22a. The current through conductive path 40 may be induced by an application of voltage to a gate of program transistor 28. Accordingly, the term "program transistor", as used herein, may refer to a transistor coupled to a series of conductive structures used to induce a magnetic field about a magnetic cell junction for a write operation of a memory cell.

In light of the different adaptations of conductive paths 38 and 40 to conduct current through and adjacent to magnetic cell junction 24, respectively, the lines representing the conductive structures of conductive paths 38 and 40 in FIG. 1 are illustrated in different schematic manners relative to magnetic cell junction 24. In particular, the lines representing structures of conductive path 38 include a line extending from conductive line 36 to magnetic cell junction 24 and another line extending from magnetic cell junction 24 to read transistor 26. Consequently, the portion of conductive path 38 through magnetic cell junction 24 is not depicted with a line. The line representing structures of conductive path 40, on the other hand, is shown extending from conductive line 36 to program transistor 28, with the portion adjacent to magnetic cell junction 24 shown.

The incorporation of conductive line 36 allows bit line BL0 to be spaced apart from magnetic cell junction 24 as well as other cell junctions aligned with the bit line. In some embodiments, conductive line 36 may be of sufficient length such that the current drawn through bit line BL0 does not induce a magnetic field which substantially affects the state of magnetic cell junction 24. Instead, the state of magnetic cell junction 24 may be altered by the magnetic field induced through conductive path 40, and, therefore may be specific to the cell junction. Consequently, the projection of conductive line 36 from bit line BL0 to conductive paths 38 and 40 may, in some embodiments, allow magnetic cell junction 24 to be written to and read from, respectively, without having magnetic fields induced about other magnetic cell junctions in magnetic memory array 20. In this manner, magnetic memory array 20 may be configured to selectively program magnetic cell junction 24 without disturbing other magnetic cell junctions in the array. In general, the length of conductive line 36, which may be defined as the conductive structure extending from bit line BL0 to magnetic cell junction 24, may be between approximately 0.1 microns and approximately 1 micron. Conductive line 36 may have larger or smaller lengths, however, depending on the design specifications of memory array 20. For example, the length of conductive line 36 may depend on the amount of voltage applied to bit line BL0 as well as the resistivity of the bit line, since the magnitude of magnetic fields is directly proportional to the amount of current within a line.

In some embodiments, the magnetic field induced by conductive path 40 may be sufficient to set and/or change the direction of magnetic vectors within magnetic cell junction 24 such that a particular bit value may be stored therein. Consequently, in some embodiments, the inclusion of digit lines in magnetic memory array 20 may not be necessary and, therefore, are omitted in FIG. 1. In particular, since each magnetic cell junction may be written to individually, the cross-hatch pattern of bit lines and digit lines may not be necessary to identify a selected memory cell. Consequently, the write selectivity of an array with configuration described herein may be increased or negated since other memory cells will generally not be disturbed by magnetic fields induced within adjacent bit lines or digit lines during the write operation of the array. As a result, the reliability of an array described herein may be greater than an array having a conventional configuration of cross-hatched bit and digit lines. In an alternative embodiment, digit lines may be included within magnetic memory array 20 to aid in selecting a particular memory cell for a write operation of the array.

In addition to increasing the write selectivity of the magnetic memory array, the configuration of conductive path 40 may, in some embodiments, reduce the amount of current used to operate magnetic memory array 20 relative to conventional memory arrays having cross-hatched bit and digit lines. In particular, the amount of current used to operate a magnetic memory array 20 may be reduced to a level at which the effect of the IR drop along the line is no longer a limiting factor for the size of the memory array. Consequently, the number of cell junctions within the magnetic memory array 20 may be larger than the number of cell junctions included in conventional memory arrays having cross-hatched bit and digit lines. In addition, the overall power requirements of the memory array 20 may be reduced. Exemplary configurations of conductive paths which are adapted to reduce the amount of current used to operate magnetic memory arrays relative to conventional memory arrays having cross-hatched bit and digit lines are illustrated in FIGS. 6a–7c and are discussed in more detail below.

As shown in FIG. 1, read transistor 26 may be coupled between magnetic cell junction 24 and ground line 30 and may have a gate within word line 32. Program transistor 28 may be coupled between magnetic cell junction 24 and program line PROG0 and have a gate within word line 34. In general, the term "word line," as used herein, may refer to a conductive line having a gate of a transistor used to induce current flow through or adjacent to a magnetic cell junction for read and write operations of a memory cell, respectively. As shown in FIG. 1, word lines 32 and 34 may include gates of a plurality of transistors used for read and write operations of memory cells. In particular, word line 32 may include gates for a plurality of read transistors and word line 34 may include gates for a plurality of program transistors. In other embodiments, word lines 32 and/or 34 may include gates of read and program transistors. An exemplary embodiment including such a configuration is described in more detail below in reference to FIG. 4.

Figure 2:
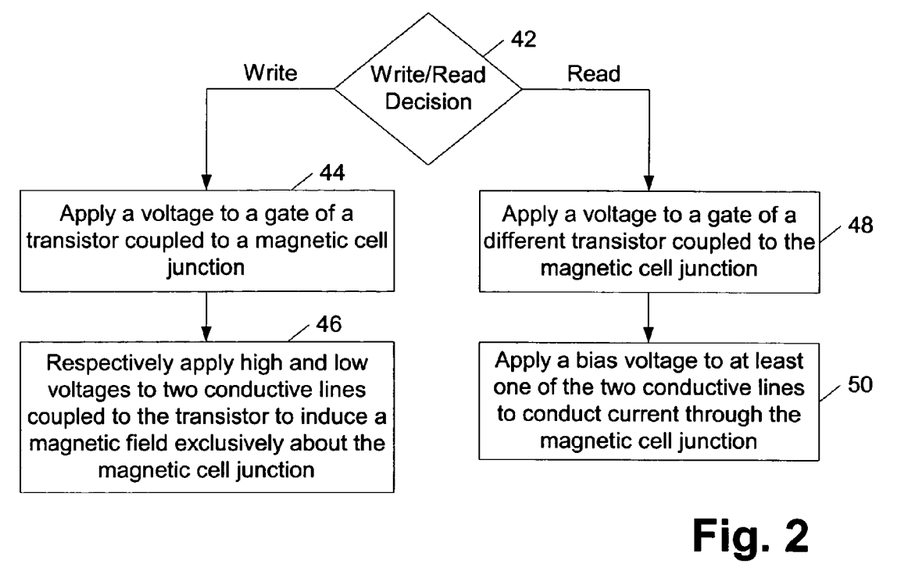
FIG. 2 depicts a flowchart outlining a method of operation for a magnetic memory array.

A method for operating a magnetic memory array is outlined in the flowchart depicted in FIG. 2. In general, the method may be applicable for any magnetic memory array described herein. As such, although the method is described below in reference to magnetic memory array 20 shown in FIG. 1, the method is not restricted to magnetic memory arrays with such a configuration. As shown in FIG. 2, the method may include decision block 42 to determine whether a read or a write operation will be performed within the magnetic memory array. The method may continue to block 44 for a write operation and may continue to block 48 for a read operation as shown in FIG. 2. In other cases, the method may continue directly to block 46 for a write operation and/or block 50 for a read operation. Consequently, the method described herein for operating a magnetic memory array is not restricted to the arrangement of steps outlined in the flowchart of FIG. 2. For example, in some embodiments, blocks 44 and 46 and/or blocks 48 and 50 may be conducted in a reverse order relative to the order of blocks presented in FIG. 2. In yet other embodiments, blocks 44 and 46 and/or blocks 48 and 50 may be conducted simultaneously for the write and read operations of an array, respectively.

As noted above, a write operation for a magnetic memory array may include block 44 which specifies that a voltage be applied to a gate of a transistor coupled to a magnetic cell junction. In reference to magnetic cell 22a in FIG. 1, block 44 may include applying a voltage to word line 34 such that program transistor 28 may be turned "on." In this manner, current may be conducted through conductive path 40 upon the application of voltages along bit line BL0 and program line PROG0 as described in more detail below in reference to block 46. In some cases, the voltage applied to word line 34 to turn "on" program transistor 28 may be less than approximately 3 volts. Larger or smaller voltages may be appropriate, however, depending on the design specifications of the magnetic memory array. In embodiments in which a voltage is applied to word line 32 prior to or during a write operation of memory cell 22a, the voltage applied to word line 32 may be reduced or terminated such that read transistor 26 may be turned "off" to protect magnetic cell junction 24 from high voltages. In other embodiments, no voltage may be applied to word line 32 prior to or during a write operation of memory cell 22a.

As shown in FIG. 2, the method may further include block 46 for write operations of a magnetic memory cell. Block 46 includes respectively applying high and low voltages to two conductive lines coupled to the transistor turned "on" from the process described in reference to block 44. The process of block 46 may be described in reference to magnetic memory array 20 in FIG. 1 as applying high and low voltages to bit line BL0 and program line PROG0 respectively or, in some embodiments, vice versa. In particular, a high voltage may be applied to bit line BL0 and a low voltage may be applied to program line PROG0. In other cases, a low voltage may be applied to bit line BL0 and a high voltage may be applied to program line PROG0.

The allocation of high and low voltages to the two conductive lines generally determines the direction of current flow through conductive path 40 and, therefore, determines the direction magnetic vectors within the magnetic field induced from conductive path 40. In turn, allocation of high and low voltages to the two conductive lines may generally determine the direction magnetic vectors within magnetic cell junction 24 are set. In particular, the direction of current flow through conductive path 40 may set the stored bit value within magnetic cell junction 24 as parallel or anti-parallel, representing low and high resistance states, respectively. In either case, the voltages applied to bit line BL0 and program line PROG0 may be sufficient to generate a current between approximately 0.5 mA and approximately 10.0 mA through conductive path 40. In particular, the voltages applied to bit line BL0 and program line PROG0 may be between approximately 1 volt and approximately 4.5 volts. Larger or smaller voltages and/or current, however, may be appropriate for the write operations of the memory cell, depending on the design specifications of the device.

As shown in FIG. 2, a read operation for a magnetic memory array may include block 48 in which a voltage is applied to a gate of a different transistor coupled to the magnetic cell junction. In addition, the read operation may include block 50 in which a bias voltage is applied to at least one of the two conductive lines used for write operations of the memory cell. Such processes, described in reference to FIG. 1, may include applying a voltage to word line 32 such that read transistor 26 may be turned "on" and applying a bias voltage to bit line BL0. The bias voltage applied to bit line BL0, in such an embodiment, may generally be between approximately 1 volt and approximately 4.5 volts. In addition, the voltage applied to word line 32, in such an embodiment, may be less than approximately 1 volt. Larger or smaller values of voltages may be used, however, depending on the design specifications of magnetic memory array 20.

In embodiments in which a voltage is applied to word line 34 prior to or during a read operation of memory cell 22a, the voltage applied to word line 34 may be reduced or terminated such that program transistor 28 may be turned "off." In other embodiments, no voltage may be applied to word line 34 prior to or during a read operation of memory cell 22a. In some cases, a bias voltage may be applied to program line PROG0 during the read operation of memory cell 22a. Such an application of voltage may increase the operational threshold of program transistor 28 and, therefore, prevent program transistor 28 from leaking. Since program transistor 28 is turned "off" during a read operation of memory cell 22a, the application of a bias voltage along program line PROG0 does not affect the read operation of the memory cell. In other embodiments, however, a voltage may not be applied to program line PROG0 during a read operation of memory cell 22a.

Figure 3:
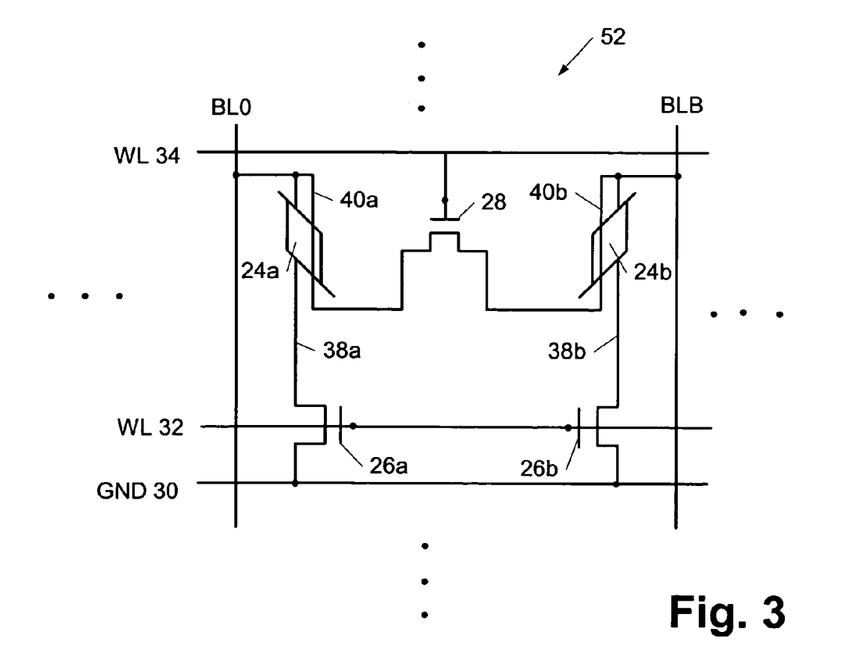
FIG. 3 depicts an electrical schematic diagram of a partial magnetic memory array with a different magnetic memory cell configuration than the magnetic memory array depicted in FIG. 1.

As noted above, magnetic memory array 20 may, in some embodiments, be configured as a differential memory cell array. In particular, magnetic memory array 20 may, in some embodiments, include two magnetic cell junctions within each memory cell of the array. An exemplary embodiment of a differential memory cell having a similar configuration of conductive structures about the magnetic cell junctions therein as described in reference to magnetic memory array 20 is shown in FIG. 3. In particular, FIG. 3 illustrates memory cell 52 including conductive paths 38a and 40a adjacent to magnetic cell junction 24a and conductive paths 38b and 40b adjacent to magnetic cell junction 24b. In addition, memory cell 52 includes bit lines BL0 and BLB, read transistors 26a and 26b, program transistor 28, ground line 30 and word lines 32 and 34.

In general, the components of memory cell 52 may be similar to the components which share the similar respective reference numbers within memory cell 22a of FIG. 1. For example, read transistors 26a and 26b may be adapted to enable current flow through magnetic cell junctions 24a and 24b, respectively, upon the application of voltage along word line 32. In particular, read transistors 26a and 26b may be adapted to enable current flow through conductive paths 38a and 38b to ground line 30 upon the application of a voltage along word line 32. In addition, program transistor 28 may be adapted to enable current flow adjacent to magnetic cell junctions 24a and 24b by the application of voltage along word line 34 for the write operations of memory cell 52. More specifically, program transistor 28 may be adapted to enable current flow through conductive paths 40a and 40b upon an application of voltage to word line 34. Memory cell 52, however, may differ from magnetic memory cell 22a in FIG. 1 in that conductive paths 40a and 40b adjacent to magnetic cell junctions 24a and 24b may be connected such that opposite bits may be stored to each of the junctions and a differential resistance may be measured between them. As a consequence, program line PROG0 may be omitted from the configuration of memory cell 52. In particular, a line used only for write operations of the memory cell may be omitted and memory cell 52 may, instead, include two bit lines, bit line BL0 and bit line bar BLB. Both the BL0 and BLB lines may be used for the write and read operations of the memory cell and, therefore, are considered bit lines.

Figure 4:
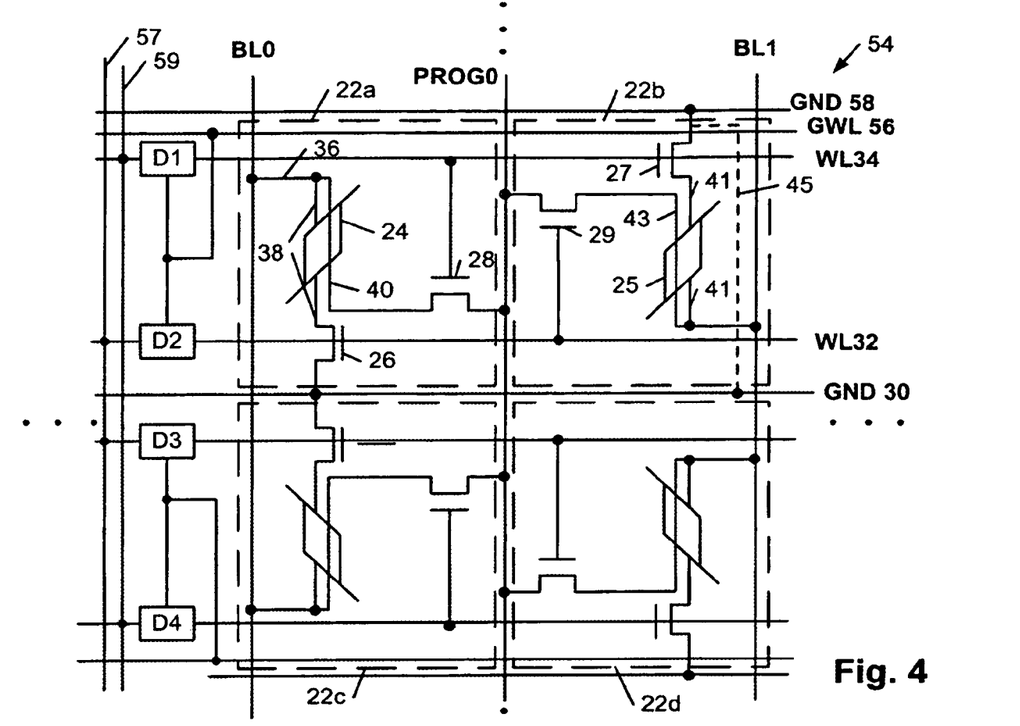
FIG. 4 depicts an electrical schematic diagram of a partial magnetic memory array with a different magnetic memory cell configuration than the magnetic memory arrays depicted in FIGS. 1 and 3.

FIG. 4 illustrates a schematic diagram of another exemplary memory array. In particular, FIG. 4 illustrates memory array 54 having word lines which are configured to individually enable read and write operations of the array. In general, memory array 54 may include similar components as those included in memory array 20 of FIG. 1. In particular, memory array 54 may include bit lines BL0 and BL1, program line PROG0 and memory cells 22a–22d. As shown in FIG. 4, memory cell 22a may include magnetic cell junction 24, conductive paths 38 and 40, read transistor 26, program transistor 28, word lines 32 and 34 and ground line 30. Each of such components may function in a manner similar to the component in memory array 20 of FIG. 1 having the same reference number. For instance, read transistor 26 may be adapted to enable current flow through conductive path 38 and magnetic cell junction 24 upon the application of voltage along word line 32. In addition, program transistor 28 may be adapted to enable current flow adjacent to magnetic cell junction 24 through conductive path 40 by the application of voltage along word line 34 for the write operations of memory array 54.

Memory array 54, however, may differ from magnetic memory array 20 in FIG. 1 in that word lines 32 and/or 34 may be used for both write and read operations of the array. In particular, word line 32 may be used to enable a read operation for memory cell 22a as noted above and a write operation for memory cell 22b, for example. In addition or alternatively, word line 34 may be used to enable a write operation for memory cell 22a and a read operation for memory cell 22b in some embodiments. Consequently, memory cell 22b may, in some cases, include a different configuration of components than memory cell 22a as shown in FIG. 4. In particular, memory cell 22b may include magnetic cell junction 25 coupled between program line PROG0 and bit line BL1. In addition, memory cell 22b may include read transistor 27, program transistor 29, ground line 58 and conductive paths 41 and 43.

As shown in FIG. 4, read transistor 27 and program transistor 29 may be arranged within word lines 34 and 32, respectively. Accordingly, read transistor 27 may be adapted to enable current flow through conductive path 41 by the application of a sufficient voltage along word line 34. In addition, program transistor 29 may be adapted to enable current flow through conductive path 43 adjacent to magnetic cell junction 25 upon an application of a sufficient voltage to word line 34. The configuration of read transistor 27 and program transistor 29 is opposite to the arrangement of read transistor 26 and program transistor 28 in memory cell 22a in which transistors 26 and 28 are configured to enable current flow upon the application of voltages to word lines 32 and 34, respectively. As a consequence, memory array 54 includes two separate ground lines for read transistors 26 and 27. In particular, memory array 54 may include ground line 30 coupled to read transistor 26 and ground line 58 coupled to read transistor 27. In some embodiments, read transistors 26 and 27 may be coupled to a common ground line such that the number of ground lines within memory array 54 may be minimized. For example, read transistor 27 may be coupled to around line 30 instead of around line 58 as shown by dashed line 45 in FIG. 4, indicating an alternative embodiment of read transistors 27 and 29 coupled to the same around line. In yet other embodiments, read transistors 27 and 29 may be alternatively coupled to around line 58.

In any case, memory array 54 offers a configuration having word lines used for both write and read operations of the array. In particular, memory array 54 includes word line 32 comprising a gate of read transistor 26 which is configured to enable a read operation for magnetic cell junction 24. In addition, word line 32 includes a gate of program transistor 29 which is configured to enable a write operation for magnetic cell junction 25. Moreover, memory array 54 includes word line 34 having a gate of program transistor 28 which is configured to enable a write operation for magnetic cell junction 24 and a gate of read transistor 27 which is configured to enable a read operation for magnetic cell junction 25. In some embodiments, memory array 52 may include other memory cells coupled to word lines 32 and 34. The other memory cells may include a configuration similar to memory cell 22a and/or 22b such that word lines 32 and/or 34 may be used to enable both read and write operations for a plurality of memory cells. In some embodiments, the memory cells may be configured such that the gates of the read and program transistors alternate along word lines 32 and/or 34. An exemplary configuration of a microelectronic topography including such a configuration is described in more detail below in reference to FIG. 5. In other embodiments, the memory cells may be configured such that the gates of the read and program transistors do not alternate along word lines 32 and/or 34.

In some cases, memory array 54 may include sets of memory cells having a similar configuration as memory cells 22a and 22b which are coupled to other word lines in the array. For example, memory array 54 may include memory cells 22c and 22d having similar configurations as memory cells 22a and 22b, respectively. As shown in FIG. 4, the arrangement of memory cells 22c and 22d may be inverted in some embodiments such that the read transistor within memory cell 22c may be coupled to ground line 30. In this manner, the read transistors of memory cells 22a and 22c may be coupled to a common ground line. In other embodiments, memory cells 22c and 22d may be arranged in the same upright manner as memory cells 22a and 22b, respectively. In either case, memory array 54 may, in some embodiments, include two distinct ground lines coupled to the read transistors of memory cells 22a and 22c.

As shown in FIG. 4, memory cell 54 may further differ from memory array 20 in FIG. 1 by the inclusion of a single program line between memory cells 22a and 22b. Alternately stated, memory cell 54 may be configured such that program transistors 28 and 29 are coupled to common program line PROG0. As noted above, program transistors 28 and 29 may be activated by word lines 34 and 32, respectively. In general, the programming of magnetic cell junctions is performed in distinct steps and, therefore, voltages may not generally be applied to word lines 32 and 34 at the same time. As a result, program transistors 28 and 29 may be coupled to the same program line without causing current to be conducted through both conductive paths 40 and 43 simultaneously.

In addition, voltage is not generally applied to both bit lines BL0 and BL1 during a read or write operation of memory array 54. Consequently, although read transistors 26 and 27 may be activated with program transistors 29 and 28, respectively upon the application of voltages to word lines 32 and 34, magnetic junctions 24 and 25 may not be read during a write operation of the memory array. In particular, although read transistor 26 may be turned "on" during the programming of memory cell 22b, current does not flow adjacent to magnetic cell junction 24 due to the lack of current along bit line BL0. Similarly, although read transistor 27 may be turned "on" during the programming of memory cell 22a, current does not flow adjacent to magnetic cell junction 25 due to the lack of current from bit line BL1. In addition, even though program transistors 28 and 29 may be respectively turned "on" with read transistors 27 and 26 during a read operation of the array, the magnetic junction coupled to the activated program transistor is not programmed since voltages are not applied to both bit lines BL0 and BL1 during a read operation of the memory array. In particular, although program transistor 28 may be turned "on" during a read operation of memory cell 22b, current does not flow through magnetic cell junction 24 due to the lack of current along bit line BL1. Similarly, although program transistor 29 may be turned "on" during the read operation of memory cell 22a, current does not flow through magnetic cell junction 25 due to the lack of current from bit line BL0.

As shown in FIG. 4, memory cell array 54 may, in some embodiments, include global word line 56 coupled to word lines 32 and 34. In particular, word lines 32 and 34 may respectively include decoders D1 and D2, which are in turn coupled to global word line 56 and address line 59. Address line 59 may generally serve to activate decoder D1 or D2. Global word line 56 may generally serve to supply a voltage along word line 32 or 34 when decoders D1 and D2 are activated, respectively. Such a global word line may serve to provide a single source of voltage for the read and program transistors arranged within word lines 32 and 34 and, consequently, may, in some embodiments, reduce the amount of overall power needed to operate memory array 54 relative the overall power needed to operate memory array 20 in FIG. 1. The inclusion of global word line 56 and address line 59, however, is not necessarily specific to the configuration of memory array 54 enabling word lines 32 and 34 to be used for both read and write operations of the memory array. As such, global word line 56 and address line 59 may be omitted from memory array 54 in some embodiments. In some cases, global word line 56 and address line 59 may be incorporated within memory array 20 of FIG. 1 and, consequently, offer a manner in which to reduce the overall power requirements of memory array 20. As shown in FIG. 4, memory array 56 may include address line 57 coupled to the word lines within memory cells 22c and 22d.

In particular, address line 57 may be configured to respectively activate decoders D3 and D4 independent of decoders D1 and D2.

Figure 5:
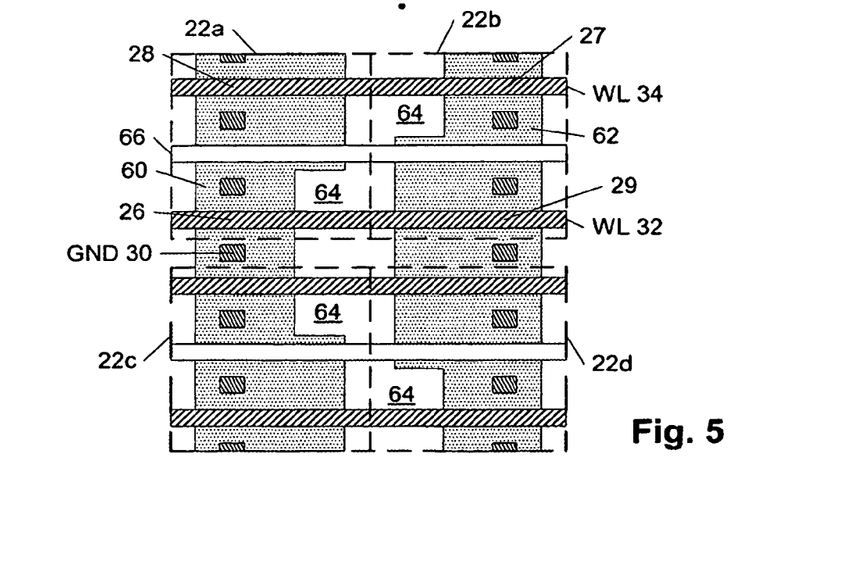
FIG. 5 depicts a partial top view of a microelectronic topography including the transistors depicted in the magnetic memory array of FIG. 4.

FIG. 5 illustrates a partial top view of a microelectronic topography including the transistors depicted in memory array 54 of FIG. 4. In particular, FIG. 5 illustrates a microelectronic topography depicting word line 34 comprising program transistor 28 and read transistor 27. In addition, FIG. 5 illustrates word line 32 comprising read transistor 26 and program transistor 29. As shown in FIG. 5, isolation structure 66 may be interposed between word lines 32 and 34 such that the transistors comprising the word lines may be isolated from each other. As in FIGS. 1 and 4, memory cells 22a–22d are outlined in FIG. 5 to distinguish the arrangement of memory cells within the array and to describe components of the memory cells. Therefore, the dotted lines outlining the periphery of the memory cells in FIG. 5 are not included within the memory array and do not serve a function for the memory array. In addition, the placement of the dotted-line boundaries are arbitrary and therefore, the size of the memory cells are not restricted to the dotted lines themselves.

In general, program transistors 28 and 29 may need to enable larger amounts of current flow than read transistors 26 and 27 due to the current needed to induce magnetic fields by which to set the magnetic directions of magnetic cell junctions 24 and 25. Consequently, program transistors 28 and 29 may be larger than read transistors 26 and 27 in some embodiments as shown in FIG. 5. In particular, diffusion regions 60 and 62 may be configured to have a smaller area in the vicinity of read transistors 26 and 27 than program transistors 28 and 29, respectively. The configuration of having read and program transistors alternately arranged within word lines of a memory array, as described above and illustrated in FIG. 5, may advantageously allow the size of memory cells within the array to be reduced in some embodiments. In particular, diffusion regions 60 and 62 may be configured such that the isolation region 64 has similar spacing between transistors 27 and 28 as transistors 26 and 29. In other words, the extended diffusion region area needed for program transistors 28 and 29 may be aligned facing the indented diffusion region employed for read transistors 26 and 27, respectively. As a result, the size of memory cells 22a and 22b may be reduced relative to an embodiment in which word lines 32 and 34 exclusively include gates of either read or program transistors.

Figures 6A, 6B, 6C, 6D, 7A:
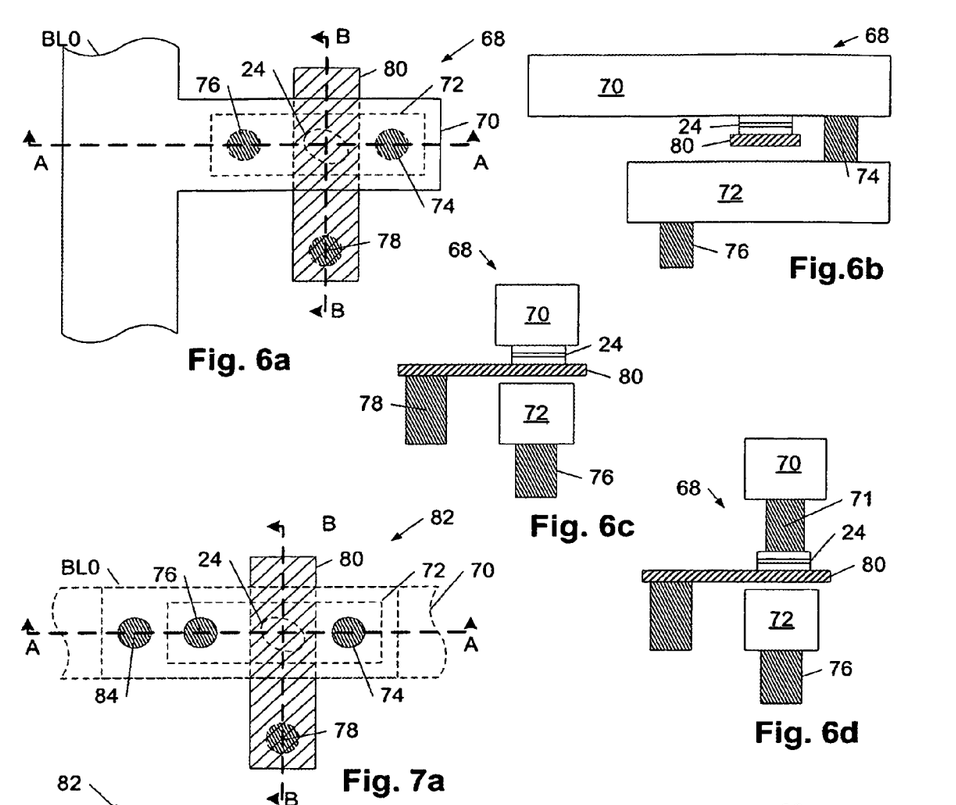

FIGS. 6a–6c illustrate an exemplary configuration of conductive structures arranged about magnetic cell junction 24 which may constitute conductive paths 38 and 40 of memory arrays 20, 52 or 54. In particular, FIG. 6a illustrates a partial top view of microelectronic topography 68 having a configuration of conductive structures coupled to bit line BL0 and arranged adjacent to magnetic cell junction 24. FIG. 6b illustrates a partial cross-sectional view of microelectronic topography 68 taken along line AA of FIG. 6a and FIG. 6c illustrates a partial cross-sectional view microelectronic topography 68 taken along line BB of FIG. 6a. An alternative configuration of the structures which may be configured within microelectronic topography 68 is shown in FIG. 6d, specifically with conductive structure 70 spaced apart from magnetic cell junction 24 by via 71. Such an alternative configuration of conductive structure 70 with respect to magnetic cell junction 24 may be applied to other views of microelectronic topography 68 (similar to those shown for FIGS. 6a and 6b, for example), but have not been illustrated for the sake of brevity. In general, the configurations depicted in FIGS. 6a–6d may be employed within memory array 20, 52 or 54. As such, FIGS. 6a–6d are not necessarily restricted to one embodiment of the memory array described herein.

As shown in FIGS. 6a–6d, microelectronic topography 68 may include conductive structures 70 and 72, vias 74, 76 and 78 and electrode 80. In particular, magnetic cell junction 24 may be interposed between conductive structure 70 and electrode 80, which is in turn coupled to via 78 as shown in FIGS. 6c and 6d. Via 78 may be coupled to additional conductive structures which couple to read transistor 26 of memory cell 22a. In this manner, conductive structure 70, magnetic cell junction 24, electrode 80, via 78 and the other conductive structures coupled to read transistor 26 may constitute conductive path 38. In particular, current induced from an application of voltage to bit line BL0 may travel through such structures for a read operation of the memory cell. For such a configuration, conductive structure 70 is preferably arranged in contact with magnetic cell junction 24 as shown in FIG. 6c such that the current may be conducted therethrough. In other embodiments, however, conductive structure 70 may be spaced above magnetic cell junction 24 and coupled thereto by a via, such as shown in FIG. 6d.

FIG. 6b depicts an alternate view of microelectronic topography 68 to show conductive structures 70 and 72 connected by via 74. In general, via 74 may include any configuration which connects conductive structures 70 and 72. For example, via 74 may include a substantially straight, single via as shown in FIG. 6b. In other embodiments, however, via 74 may be include a variety of patterns other than a straight single via. As such, configurations of via 74 other than the one shown in FIG. 6b may be alternatively arranged within microelectronic topography 68 in some embodiments. FIG. 6b further illustrates conductive structure 72 coupled to via 76, which may be coupled to one or more other conductive structures which are in turn coupled to program transistor 28 of memory cell 22a. The arrangement of conductive structures 70 and 72, vias 74 and 76 and one or more other conductive structures coupled thereto may constitute conductive path 40.

It is noted that the series of conductive structures constituting conductive path 40 may be altered from the illustrations depicted in FIGS. 6a–6d. For example, in some embodiments, conductive structure 70 extending from bit line BL0 may be aligned with the lower side of magnetic cell junction 24 and conductive structure 72 may be aligned with the upper side of magnetic cell junction 24. In such an embodiment, the arrangement of via 74 and 76 may be altered such that conductive path 40 may run under and then above magnetic cell junction 24 down to a program transistor arranged below. Conductive structure 72, in such an embodiment, may be arranged in contact with the cell junction and, therefore, may serve as part of conductive path 38 in some cases. In either case, conductive structures 70 and 72 may, in some embodiments, be arranged such that conductive path 40 passes magnetic cell junction 24 in two distinct segments. Such an arrangement of structures is described in more detail below and is referred to interchangeably herein as a "loop around" or "fold back" configuration.

Although the description of conductive path 40 below is described in reference to the fold back configuration of conductive structures 70 and 72 around magnetic cell junction 24, conductive path 40 of the memory arrays described herein may, in some embodiments, include a series of conductive structures which do not loop around the cell junction. In particular, conductive path 40 may, in some embodiments, include one or more conductive structure arranged along one side of magnetic cell junction 24 and may be substantially absent of structures along the opposing side of the cell junction. An exemplary configuration of conductive path 40, in such an embodiment, may include conductive structure 70 arranged adjacent to magnetic cell junction 24 as shown in FIGS. 6a–6d. The position of conductive structures 72 and 76, however, may be modified such that the conductive path within the series of structures continues downward from via 74 without being arranged in close enough proximity to magnetic cell junction 24 to induce a magnetic field which may affect the junction's magnetic state. Alternatively, conductive structure 72 may be arranged adjacent to magnetic cell junction 24 as shown in FIGS. 6a–6d and the position of conductive 70 may be altered such that a magnetic field induced therefrom does not affect the magnetic state of magnetic cell junction 24. The magnitude of magnetic fields generated from memory arrays including such non-fold back configurations are discussed in more detail below relative to the magnitude of magnetic fields generated from memory arrays with the fold back arrangement. In addition, the voltage requirements of memory arrays including non-fold back configurations are discussed in more detail below relative to memory arrays with the fold back arrangement.

For the fold back or loop around configuration, conductive structures 70 and 72 may be aligned along opposing sides of magnetic cell junction 24 as shown in FIG. 6b and, therefore, may serve to induce magnetic fields about the cell junction for a write operation of memory cell 22a. In some cases, conductive structures 70 and 72 may be aligned parallel to one another as shown in FIG. 6b. In other cases, however, conductive structures 70 and 72 may be angled relative to each other. As noted above, conductive structures 70 and 72 may be coupled together by via 74. Consequently, the direction of current flow within conductive structures 70 and 72 may be different and, in some cases, directly opposite from each other. More specifically, conductive structure 70 may include direction of current flow to the right, while conductive structure 72 may include direction of current flow to the left when current flow is induced from bit line BL0 to program line PROG0 or bit line BLB of the memory array in which microelectronic topography 68 is arranged. Alternatively, conductive structure 70 may have a direction of current flow to the left and conductive structure 72 may have a direction of current flow to the right when current flow is induced from program line PROG0 or bit line BLB to bit line BL0.

In either case, the configuration of conductive path 40 to fold back or loop around magnetic cell junction 24 may advantageously increase the magnetic field induced about the cell junction. In particular, the arrangement of conductive structures 70 and 72 aligned along opposing sides of magnetic cell junction 24 and connected by via 74 may approximately double the magnetic field induced about magnetic cell junction 24 relative to an embodiment in which conductive path 40 is not configured to fold back or loop around cell junction 24. In some cases, the fold back or loop around configuration may offer an even larger magnetic field relative to memory arrays including cross-hatched bit and digit lines. In particular, for a given amount of current, the effective current through a conductive path having a fold back or loop around configuration may be approximately 2.8 times larger than the effective current generated from a cross-hatched pattern of bit and digit lines. Consequently, the magnitude of the magnetic field induced by a fold back or loop around configuration may be approximately 2.8 times larger than a magnetic field induced by a configuration of cross-hatched bit and digit lines in some embodiments.

The calculation of the factor of 2.8 is computed from an embodiment in which the amount of current applied to the bit and digit lines of the conventional memory array are equal and the same total amount of current is applied to conductive path 40 in the memory array described herein. In some cases, however, the same amount of current may not be applied to bit and digit lines of a conventional memory array during a write operation of the array. In addition, the memory array described herein may be used with smaller or larger amounts of current than what may be used in conventional arrays, as described in more detail below. As such, the factor used to show the relative magnitudes of magnetic fields generated by the memory array described herein and the magnetic fields generated by conventional memory arrays may be smaller or larger than approximately 2.8 in some embodiments.

In some cases, the magnitude of the magnetic field induced by the arrangement of conductive structures 70 and 72 may be sufficient to set and/or change the direction of magnetic vectors within magnetic cell junction 24 such that a particular bit value may be stored therein. Consequently, in some embodiments, the inclusion of a digit line in microelectronic topography 68 may not be necessary to identify a selected memory cell and, therefore, may be omitted as shown in FIGS. 6a–6d. Consequently, the write selectivity of a memory array with a fold-back or loop around configuration of conductive structures around magnetic cell junction 24 may be increased or negated relative to the write selectivity of a conventional memory array with cross-hatched configuration of bit and digit lines. As a result, the reliability of a memory array having a fold-back or loop around pattern of conductive structures around a magnetic cell junction may be greater than an array having a conventional configuration of cross-hatched bit and digit lines. In an alternative embodiment, digit lines may be included within microelectronic topography 68 to aid in selecting a particular memory cell for a write operation of the array.

In addition to increasing the write selectivity of the magnetic memory array, the loop around configuration of conductive structures 70 and 72 may, in some embodiments, reduce the amount of current used to operate a magnetic memory array including microelectronic topography 68. As noted above, the magnetic field induced from a fold back configuration of conductive structures 70 and 72 is considerably larger than the magnetic field induced by a configuration in which conductive structures 70 and 72 are not arranged to loop around magnetic cell junction 24. In addition, the magnetic field induced from a fold back configuration of conductive structures 70 and 72 is considerably larger than the magnetic field induced within a memory array having cross-hatched bit and digit lines. As such, for a given magnitude of a magnetic field needed to program a memory cell junction, a smaller amount of current may be used to operate a magnetic memory array including microelectronic topography 68 relative to memory arrays without such a topography.

For example, the amount of current used to operate a magnetic memory array including microelectronic topography 68 may less than approximately 5 mA in some embodiments. An amount of current used to operate a magnetic memory array having conductive path 40 without a loop around configuration, as described above, may be approximately 10 mA in some embodiments. In contrast, an amount of current used to operate a magnetic memory array with a configuration of cross-hatched bit and digit lines may be greater than approximately 15 mA in some embodiments. Consequently, the overall power requirements of a magnetic memory array including microelectronic topography 68 may be reduced relative to memory arrays having conductive path 40 without a loop around configuration and memory arrays with a cross-hatched pattern of bit and digit lines. In some cases, the amount of current used to operate a magnetic memory array including microelectronic topography 68 may be reduced to a level at which the effect of the IR drop along the bit line or program lines of the memory array is no longer a limiting factor for the size of the memory array. In such an embodiment, a magnetic memory array including microelectronic topography 68 may include a larger number of cell junctions than memory arrays without such a microelectronic topography.

In some cases, it may be advantageous to orient magnetic cell junction 24 and/or conductive structures 70 and 72 relative to each other to optimize the switching mechanisms of the magnetic cell junction. For example, magnetic cell junction 24 and/or conductive structures 70 and 72 may, in some embodiments, be oriented such that the aggregate magnetic field generated from conductive structures 70 and 72 is not directed along an easy axis of the cell junction. An easy axis of magnetization of a magnetic cell junction may be referred to as the line along which magnetic vectors within the cell junction are aligned when no external energy is applied to the junction. In contrast, a hard axis of magnetization may refer to the line that requires the largest external field to maintain a vector pattern state in between two easy axes of magnetization.

In some embodiments, easy and hard axes orientations may be dependent on the shape of the magnetic cell junction. For example, in some embodiments, a magnetic cell junction may be fabricated to have an elliptical shape. Since the innate alignment of magnetic vectors within a layer may, in some embodiments, follow the shape of the layer, the magnetization direction of layers within an elliptically shaped magnetic junction may, in some embodiments, align with the elongated dimension of the cell junction when no external field is applied. Consequently, in some embodiments, the elongated dimension of an elliptically shaped cell junction may be referred to as the easy axis of the junction. In other cases, however, other directions along an elliptically shaped magnetic cell junctions may additionally or alternatively be referred to as easy axes of magnetization, depending the materials used within the junctions and/or the process used to fabricate the junctions.

As stated above, the hard axis of magnetization may be designated as the direction that requires the largest external field to maintain a vector pattern state in between two easy axes of magnetization. In some cases, maintaining the magnetic vectors in a direction that is substantially perpendicular to the easy axes of the junction may require the largest magnetic field between such axes. Consequently, in some embodiments, the shortened dimension of an elliptically shaped magnetic junction may be referred to as the hard axis of magnetization. Other directions along an elliptically shaped magnetic cell junctions, however, may additionally or alternatively referred to as hard axes of magnetization, depending on the design specifications of the array. In yet other embodiments, a magnetic cell junction may not include easy and hard axes of magnetization. As such, although configuration of memory cell 22a is sometimes described in reference to the easy and hard axes magnetic cell junction 24, the configuration of memory cell 22a is not restricted to such directions of the magnetic cell junctions.

In addition, it is noted that although the description of manipulating logic states within magnetic junction 24 is directed at elliptically shaped magnetic junctions, other shapes known in the MRAM fabrication industry may also or alternatively be used to promote easy and hard axes orientations within magnetic layers of cell junctions. Therefore, although configuration of memory cell 22a is sometimes described in reference to the elongated and shortened dimensions magnetic cell junction 24, the configuration of memory cell 22a is not restricted to such dimensions of the magnetic cell junction. In fact, in some embodiments, magnetic cell junctions 26a and 26b may not include elongated or shortened dimensions. Consequently, the embodiments depicted in FIGS. 6a–6d are not restricted to elliptically shaped magnetic cell junctions. In particular, the magnetic memory array configuration described herein may be incorporated with magnetic cell junctions of any shape and/or size.

In general, magnetic vectors existing within an equilibrium state of a layer (i.e., when no external energy is applied) may be more easily changed with a magnetic field which is not directly parallel with the magnetic vectors. Consequently, it is generally desirable to induce a magnetic field which is not aligned with the easy axis of the junction in order to alter the overall magnetization direction of the magnetic cell junction from its equilibrium state. As such, it may be advantageous to orient magnetic cell junction 24 and/or conductive structures 70 and 72 such that a magnetic field induced by conductive structures 70 and 72 is not directed along the easy axes of magnetic cell junction 24. For example, magnetic cell junction 24 may be oriented to have an easy axis (e.g., an elongated dimension) arranged at an angle between approximately 0° and approximately 90° relative to the parallel arrangement of conductive structures 70 and 72 as shown in FIG. 6a. In some cases, conductive structures 70 and 72 may be additionally or alternatively oriented in a non-parallel manner such that an aggregate magnetic field induced therefrom is not aligned with an easy axis of magnetic cell junction 24.

As shown in FIG. 6a, conductive structure 70 may be configured as an extension of bit line BL0 in some embodiments. In such a case, bit line BL0 may include a plurality of extensions each extending over a different magnetic cell junction within a column of the memory array. In this manner, bit line BL0 may serve as a global bit line to a single column of magnetic cell junctions. In other embodiments, bit line BL0 may further include extensions on its opposing side such that conductive structures extend over magnetic cell junctions within another column of the array. In such embodiments, bit line BL0 may serve as a global bit line to a plurality of magnetic cell junctions arranged within two columns of the array. In some cases, conductive structure 70 may be a distinct structure from bit line BL0. In particular, conductive structure 70 may be spaced apart from bit line BL0 and coupled thereto by a via. An exemplary embodiment of such a configuration is described in reference to FIGS. 7a–7c. In either case, conductive structures 70 and/or 72 may include a cladding layer configured to shield the structures such that other magnetic fields generated within the array do not affect the magnetic fields generated by structures 70 and/or 72. Such an inclusion of cladding layers may be particularly advantageous in embodiments in which bit line BL0 is arranged in close proximity with conductive structure 70. In yet other embodiments, bit line BL0 may be spaced far enough away such that conductive structures 70 and 72 may not need cladding layers.

Figure 7B:
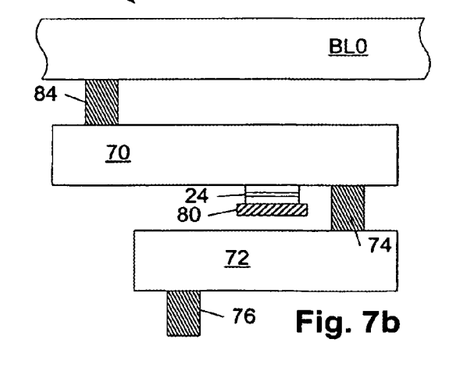
FIG. 7b depicts a partial cross-sectional view of the microelectronic topography depicted in FIG. 7a taken along line AA.
Figure 7C:
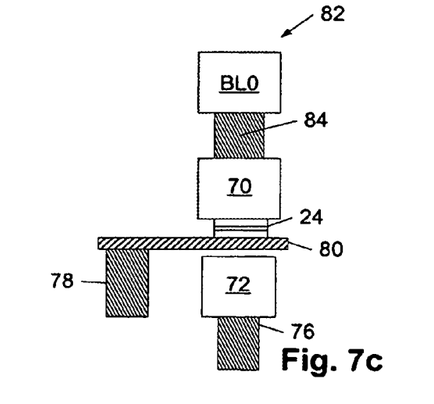
FIG. 7c depicts a partial cross-sectional view of the microelectronic topography depicted in FIG. 7a taken along line BB.

FIG. 7a illustrates a partial top view of microelectronic topography 82 having a bit line BL0 spaced apart from a configuration of conductive structures arranged adjacent to magnetic cell junction 24. FIG. 7b illustrates a partial cross-sectional view of microelectronic topography 82 taken along line AA of FIG. 7a and FIG. 7c illustrates a partial cross-sectional view microelectronic topography 82 taken along line BB of FIG. 7a. In general, the configurations depicted in FIGS. 7a–7c may be employed within memory array 20, 52 or 54. As such, FIGS. 7a–7c are not necessarily restricted to one embodiment of the memory array described herein.

In general, the arrangement of structures within microelectronic topography 82 may be similar to the arrangement of structures within microelectronic topography 68 of FIGS. 6a–6d which share the similar respective reference numbers. For example, microelectronic topography 82 may include magnetic cell junction 24, conductive structures 70 and 72, vias 74, 76, and 78 and electrode 80. In addition, microelectronic topography 82 may include conductive structure 70 directly in contact or spaced apart from magnetic cell junction 24 as similarly shown in FIGS. 6c and 6d, respectively, for microelectronic topography 68. As shown in FIGS. 7b and 7c, magnetic cell junction 24 may be interposed between conductive structure 70 and electrode 80, which may in turn be coupled to via 78. In general, via 78 may be coupled to additional conductive structures which couple to read transistor 26 of memory cell 22a. In this manner, conductive structure 70, magnetic cell junction 24, electrode 80, via 78 and the other conductive structures coupled to read transistor 26 may constitute conductive path 38. FIG. 7b depicts an alternate view of microelectronic topography 82 to show conductive structures 70 and 72 connected by via 74. FIG. 7b further illustrates conductive structure 72 coupled to via 76, which may be coupled to one or more other conductive structures coupled to program transistor 28 of memory cell 22a. Such an arrangement of conductive structures may constitute conductive path 40.

Microelectronic topography 82 may differ from microelectronic topography 68 in that conductive structure 70 is not an extension of bit line BL0. Instead, conductive structure 70 is spaced apart from bit line BL0 and coupled thereto by via 84. In some embodiments, bit line BL0 may be arranged within the same plane as conductive structure 70. In such a case, via 84 may be replaced by an interconnect line to connect bit line BL0 and conductive structure 70. In other embodiments, however, bit line BL0 may be spaced above conductive structure 70. In particular, bit line BL0 may, in some embodiments, be spaced above directly above magnetic cell junction 24 as shown in FIGS. 7a–7c. Arranging bit line BL0 in vertical alignment with magnetic cell junction 24 may be particularly advantageous for minimizing the size of the memory cell including the cell junction. In particular, the size of a memory cell may be reduced relative to memory cells in which a bit line is shifted relative to a magnetic cell junction, since the structures of the memory cell may be fabricated into a narrower region of topography. In other cases, however, bit line BL0 may be shifted relative to the position of magnetic cell junction 24 in microelectronic topography 82. In either embodiment, bit line BL0 may, in some cases, be arranged in alignment with conductive structure 70 such that bit line BL0 is aligned with a row of memory cells within the magnetic memory array including microelectronic topography 82. In other cases, bit line BL0 may be arranged in alignment with a column of memory cells within the magnetic memory array.

It will be appreciated to those skilled in the art having the benefit of this disclosure that this invention is believed to provide a magnetic memory array layout configuration. A method for operating a memory array with such a configuration is also provided. Further modifications and alternative embodiments of various aspects of the invention will be apparent to those skilled in the art in view of this description. For example, the arrangement of the structures described herein may be incorporated within single cell or differential memory cell arrays. It is intended that the following claims be interpreted to embrace all such modifications and changes and, accordingly, the specification and drawings are to be regarded in an illustrative rather than a restrictive sense.

What is claimed is:

1. A memory cell array, comprising:
  a plurality of magnetic cell junctions; and
  a first conductive line comprising:
    a gate of a first transistor configured to enable a read operation for one of the plurality of magnetic cell junctions; and
    a gate of a second transistor configured to enable a write operation for another of the plurality of magnetic cell junctions.

2. The memory cell array of claim 1, wherein the gate of the first transistor is one of a plurality of gates within the first conductive line configured to enable read operations for a first set of the magnetic cell junctions and wherein the gate of the second transistor is one of a plurality of gates within the first conductive line configured to enable write operations for a second set of the magnetic cell junctions.

3. The memory cell array of claim 2, wherein the gates configured to enable read operations for the first set of the magnetic cell junctions and the gates configured to enable write operations for the second set of the magnetic cell junctions are alternately arranged within the first conductive line.

4. The memory cell array of claim 1, further comprising a second conductive line comprising:
  a gate of a third transistor configured to enable a write operation for the magnetic cell junction having a read operation enabled by the first transistor; and
  a gate of a fourth transistor configured to enable a read operation for the magnetic cell junction having a write operation enabled by the second transistor.

5. The memory cell array of claim 4, wherein the second and third transistors are coupled to a common program line.

6. The memory cell array of claim 4, wherein the first and fourth transistors are coupled to a common ground contact.

7. The memory cell array of claim 4, wherein the first and second conductive lines are coupled to a common word line.

8. A memory cell array, comprising:
  a magnetic cell junction;
  a bit line spaced apart from the magnetic cell junction;
  a first set of conductive structures serially coupled to the bit line, wherein one or more of the first set of conductive structures are configured to induce a magnetic field about the magnetic cell junction;
  a transistor coupled to the first set of conductive structures; and
  a program line collectively configured with the bit line to induce current flow through the first set of conductive structures upon an application of a voltage to a gate of the transistor.

9. The memory cell array of claim 8, wherein the program line is further configured, with a different bit line, to induce current flow through a second set of conductive structures arranged adjacent to a different magnetic cell junction of the array upon an application of a voltage to a gate of a different transistor.

10. The memory cell array of claim 8, wherein the first set of conductive structures comprises at least two segments respectively aligned with opposing sides of the magnetic cell junction.

11. The memory cell array of claim 10, wherein the first set of conductive structures comprises a third segment connecting the at least two segments.

12. The memory cell array of claim 10, wherein the at least two segments are arranged parallel to each other.

13. The memory cell array of claim 12, wherein the magnetic cell junction is configured to have an easy axis arranged at an angle between approximately 0° and approximately 90° relative to the two segments.

14. The memory cell array of claim 10, wherein at least one of the two segments is arranged in contact with the magnetic cell junction.

15. The memory cell array of claim 10, wherein at least one of the two segments is electrically connected to the magnetic cell junction through a via.

16. The memory cell array of claim 8, wherein the bit line is spaced directly above the magnetic cell junction.

17. A memory array, comprising:
a plurality of magnetic cell junctions;
a bit line spaced above and arranged in vertical alignment with the plurality of magnetic cell junctions; and
a series one or more conductive structures coupled between the bit line and one of the plurality of magnetic cell junctions.

18. The memory array of claim 17, wherein the series of one or more conductive structures is configured to induce a magnetic field about the magnetic cell junction.

19. The memory array of claim 17, further comprising:
a transistor coupled to the series of one or more conductive structures; and
a program line collectively configured with the bit line to induce current flow through the series of one or more conductive structures upon an application of voltage to a gate of the transistor.

20. The memory array of claim 17, wherein the series of one or more conductive structures is one of a plurality of sets of serially connected conductive structures coupled between the bit line and the plurality of magnetic cell junctions.

* * * * *